(12) United States Patent
Ohtaki

(10) Patent No.: US 7,817,749 B2
(45) Date of Patent: Oct. 19, 2010

(54) DIGITAL SIGNAL RECEIVER INCLUDING WIDEBAND TUNABLE ANTENNA DEVICE

(75) Inventor: Yukio Ohtaki, Fukushima-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 789 days.

(21) Appl. No.: 11/807,213

(22) Filed: May 25, 2007

(65) Prior Publication Data

US 2007/0291877 A1 Dec. 20, 2007

(30) Foreign Application Priority Data

May 29, 2006 (JP) ............................. 2006-147697

(51) Int. Cl.
*H04L 27/06* (2006.01)
(52) U.S. Cl. ...................... 375/316; 348/733
(58) Field of Classification Search ................. 375/316; 348/726, 731–733; 455/193.1, 184.1
See application file for complete search history.

(56) References Cited

U.S. PATENT DOCUMENTS

| | | | |
|---|---|---|---|
| 4,862,516 A * | 8/1989 | Macnak et al. | 455/193.1 |
| 5,301,358 A * | 4/1994 | Gaskill et al. | 455/193.2 |
| 5,428,405 A * | 6/1995 | Lee | 348/731 |
| 5,483,688 A * | 1/1996 | English et al. | 455/184.1 |
| 5,654,766 A * | 8/1997 | McNay | 348/614 |
| 5,686,903 A | 11/1997 | Duckworth et al. | |
| 6,064,868 A * | 5/2000 | Kobayashi | 455/193.1 |

FOREIGN PATENT DOCUMENTS

| | | |
|---|---|---|
| DE | 196 19 715 A1 | 11/1996 |
| EP | 1 557 902 A1 | 7/2005 |
| JP | 11004469 | 1/1999 |
| JP | 2001-267950 | 9/2001 |
| JP | 2004-328285 | 11/2004 |
| WO | WO 88/05214 | 7/1988 |
| WO | WO 01/89036 A1 | 11/2001 |

OTHER PUBLICATIONS

European Search Report dated Sep. 20, 2007 from corresponding European Application No. 07010380.9.

* cited by examiner

*Primary Examiner*—Temesghen Ghebretinsae
(74) *Attorney, Agent, or Firm*—Beyer Law Group LLP

(57) ABSTRACT

A digital tuner unit receiving a digital signal in a reception channel having a predetermined bandwidth is connected at a subsequent stage of an antenna device containing radiation conductors and varactor diodes. A digital reception signal output from the digital tuner unit is input to a demodulation circuit and subjected to demodulation. An SP level detection unit of the demodulation circuit detects levels of a plurality of spread pilot signals in the bandwidth of the reception channel, and obtains a correction amount for a tuning voltage so that a level difference can be reduced to a predetermined value or less using the correction amount. The SP level detection unit reports the correction amount to an antenna tuning control unit so that the tuning voltage to be supplied to the antenna device can be corrected using the correction amount.

4 Claims, 6 Drawing Sheets

— : SP CARRIER
(ONE FOR EACH 12 CARRIERS)
— : INFORMATION OR
CONTROL CARRIER

200

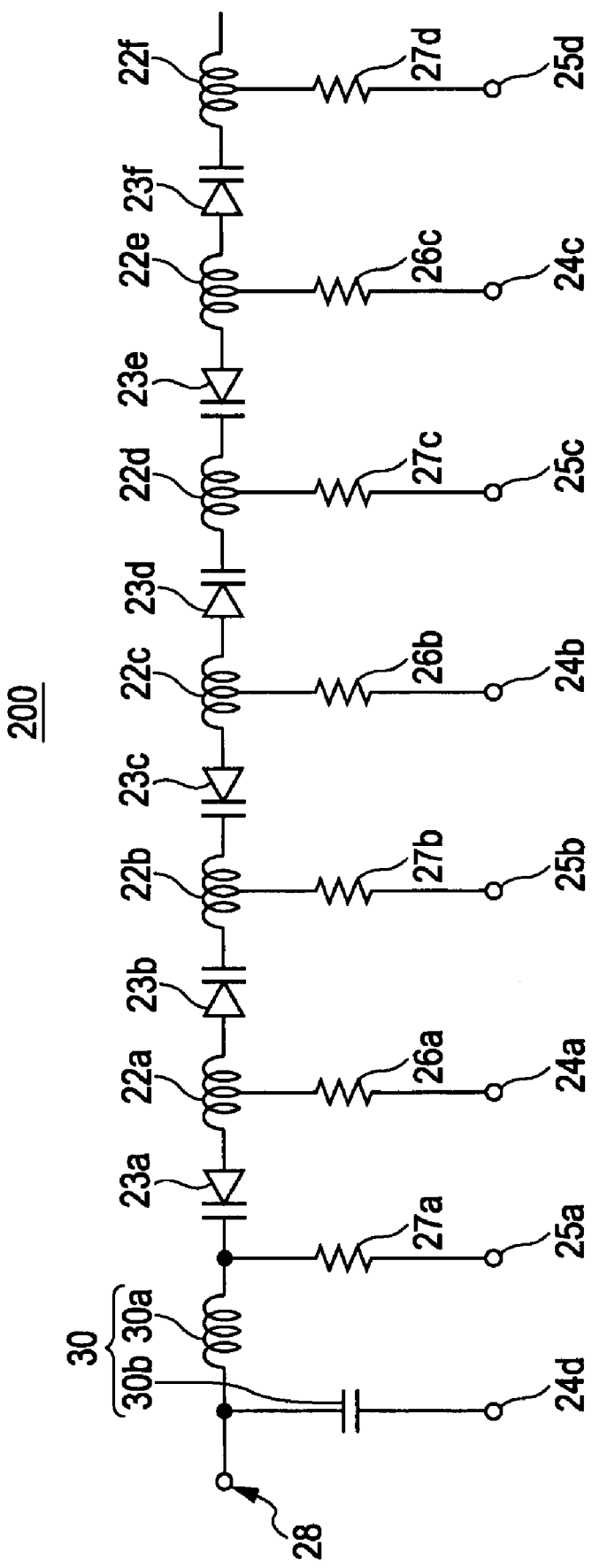

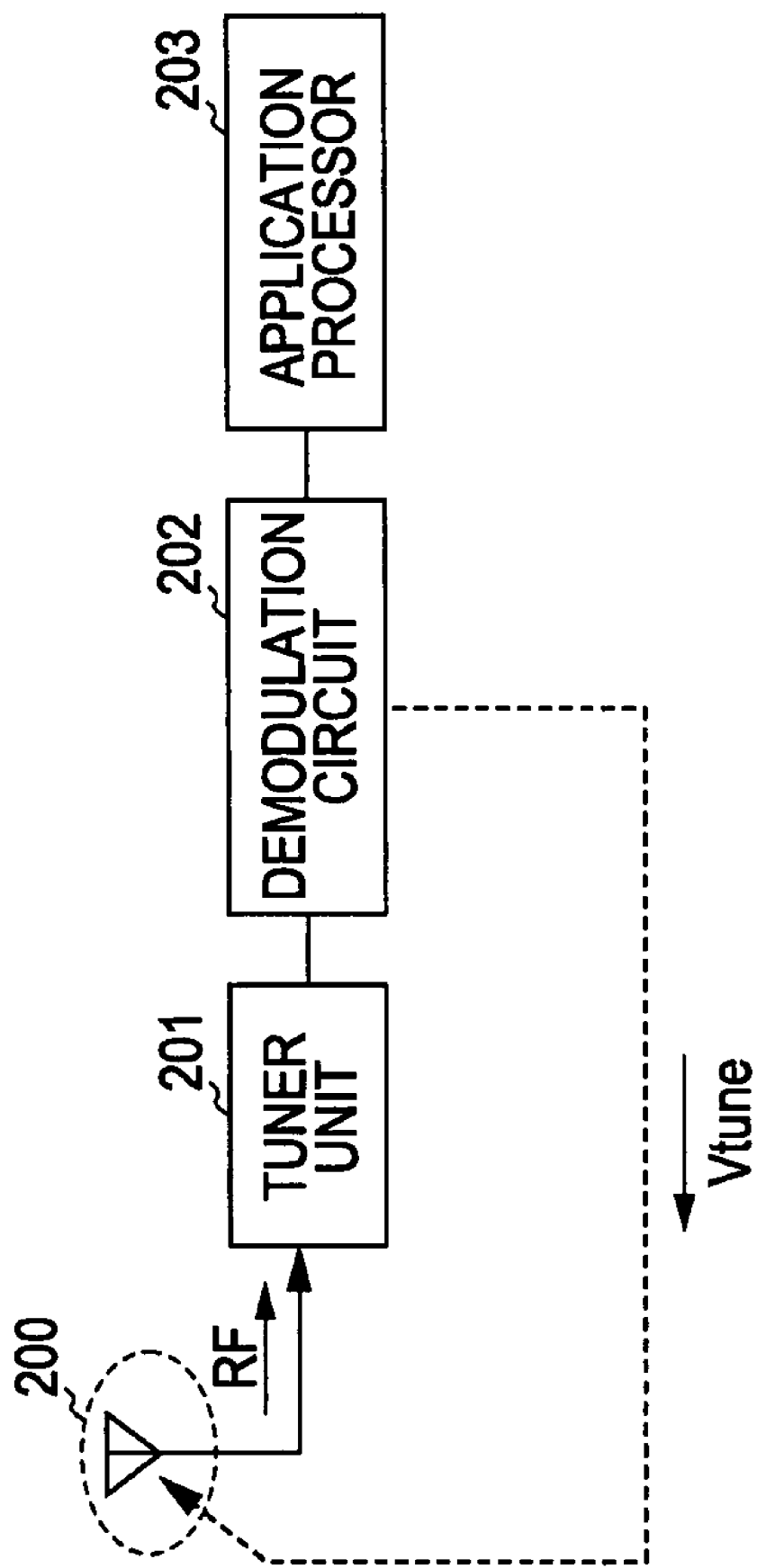

DIGITAL SIGNAL RECEIVER INCLUDING WIDEBAND TUNABLE ANTENNA DEVICE

CLAIM OF PRIORITY

This application claims benefit of the Japanese Patent Application No. 2006-147697 filed on May 29, 2006, which is hereby incorporated by reference.

BACKGROUND OF THE INVENTION

1. Field of the Invention

The present invention relates to a digital signal receiver including an antenna device tunable over a wide range of frequencies.

2. Description of the Related Art

An antenna device that contains radiation conductors and variable capacitance elements coupled to the radiation conductors and that is tunable over a wide range of frequencies is available (for example, see Japanese Unexamined Patent Application Publication No. 2004-328285).

FIG. 4 is a conceptual diagram showing an antenna device described in Japanese Unexamined Patent Application Publication No. 2004-328285. On a rectangular column-shaped base member 21 made of a dielectric material or a magnetic material, for example, six band-shaped radiation conductors 22a to 22f are divided and wound. The radiation conductors 22a to 22f and varactor diodes 23a to 23f, which are variable capacitance elements and whose number is equal to the number of radiation conductors, are disposed alternately and connected in series.

FIG. 5 is an equivalent circuit diagram of the antenna device shown in FIG. 4. The radiation conductor 22a is connected between the varactor diodes 23a and 23b, and the radiation conductor 22b is connected between the varactor diodes 23b and 23c. A similar connection relationship is continued. At the end, the varactor diode 23f is connected between the radiation conductors 22e and 22f. As shown in FIG. 5, the varactors are arranged such that adjacent varactors have opposite polarities. The radiation conductor 22a is connected between anodes of the varactor diodes 23a and 23b, which are located on a feed end side. The radiation conductor 22b is connected between cathodes of the varactor diodes 23b and 23c. The radiation conductor 22c is connected between anodes of the varactor diodes 23c and 23d. The radiation conductor 22d is connected between cathodes of the varactor diodes 23d and 23e. The radiation conductor 22e is connected between anodes of the varactor diodes 23e and 23f. The radiation conductor 22f connected to the cathode of the varactor diode 23f serves as a discharge end. The above-mentioned varactor diodes 23 are provided on a side of the base member 21.

In addition, on the side of the base member 21, first electrodes 24a to 24c for grounding the anodes of the varactor diodes 23 and second electrodes 25a to 25d for applying tuning voltages to the cathodes of the varactor diodes are formed. Substantially central parts of the radiation conductors 22a, 22c, and 22e are connected to the first electrodes 24a, 24b, and 24c through resistors 26a, 26b, and 26c, respectively. A substantially central part of the cathode of the varactor diode 23a and substantially central parts of the radiation conductors 22b, 22d, and 22f are connected to the second electrodes 25a to 25d through resistors 27a, 27b, 27c, and 27d, respectively. The above-mentioned resistors 26 and 27 are also provided on the side of the base member 21.

A third electrode 28 for supplying a signal and a first electrode 24d for grounding are also formed on the side of the base member 21. The cathode of the varactor diode 23a, which is located on the feed end side, is connected to the third electrode 28 though an impedance-matching circuit 30. The impedance-matching circuit 30 includes an inductance element 30a, which is connected between the cathode of the varactor diode 23a and the third electrode 28, and a capacitance element 30b, which is connected between the third electrode 28 and the first electrode 24d. The inductance element 30a and the capacitance element 30b are also provided on the side of the base member 21. The inductance element 30a is not necessarily provided. If the inductance element 30a is not provided, the cathode of the varactor diode located on the feed end side can be directly connected to the third electrode 28.

FIG. 6 is a schematic block diagram showing a receiver including an antenna device 200 configured as described above. An RF signal output from the antenna device 200 is input to a digital tuner unit 201. The digital tuner unit 201 performs frequency conversion of the RF signal, and tunes the signal into a reception channel. The digital tuner unit 201 inputs a digital reception signal in the reception channel to a demodulation circuit 202. The demodulation circuit 202 demodulates the digital reception signal and supplies demodulated data to an application processor 203 provided at the subsequent stage. The demodulation circuit 202 also generates a tuning voltage Vtune corresponding to a reception channel designated by an external device, and applies the tuning voltage Vtune to the second electrodes 25a to 25d of the antenna device 200.

Resonance frequency characteristics and SWR characteristics of the antenna device 200 configured as described above are shown in FIGS. 7A and 7B, respectively. As shown in FIG. 7A, the resonance frequency of the antenna device 200 increases as the tuning voltage Vtune applied to the second electrodes 25a to 25d increases. In addition, as shown in FIG. 7B, the antenna device 200 exhibits narrow band-pass characteristics at resonance frequencies (fl to fh), and the narrow band-pass characteristics are shifted by the tuning voltage Vtune.

When wideband terrestrial digital broadcasting (in Japan, a broadcasting band covers a range between 470 MHz and 770 MHz) is received, if a broadcasting band (a range between 470 MHz and 770 MHz) is divided into a plurality of resonance frequencies (narrow band-pass characteristics) and received, a wide range of frequencies can be received at an antenna having a relatively small size. For example, the resonance frequency fl of the antenna device 200 when the minimum tuning voltage, Vtune=Vl, is applied is set to the lowest frequency (470 MHz) of the broadcasting band, the resonance frequency fh of the antenna device 200 when the maximum tuning voltage, Vtune=Vh, is applied is set to the highest frequency (770 MHz) of the broadcasting band, and tuning voltages applied for achieving resonance frequencies of respective reception channels and the respective reception channels have a one-to-one relationship. When a broadcasting signal is received, the demodulation circuit 202 generates a tuning voltage Vtune corresponding to a reception channel, and applies the generated tuning voltage Vtune as a preset voltage to the second electrodes 25a to 25d. The antenna device 200 has a resonance frequency corresponding to the tuning voltage Vtune, thus being capable of receiving a reception signal in the reception channel.

However, in the above-mentioned receiver of the related art, since a tuning voltage Vtune applied for a reception channel from the demodulation circuit 202 to the antenna device 200 is a fixed voltage set in advance, when a resonance frequency is shifted due to a change in usage or environment of the antenna device 200, reception quality is deteriorated.

FIG. 8A shows a state in which an actual resonance frequency is shifted from a desired resonance frequency fl when a tuning voltage, Vtune=Vl, is applied. For example, when the resonance frequency is shifted toward lower frequencies from the desired resonance frequency fl, the signal level of a demodulated reception signal exhibits a shape in which the right shoulder drops, as shown in FIG. 8B. If the signal level of a reception signal is distorted and exhibits a shape in which the right shoulder drops or the left shoulder drops, a problem may occur in that a playback image played back by the application processor 203 on the basis of the reception signal is stopped or playback sound is distorted.

SUMMARY OF THE INVENTION

The present invention provides a digital signal receiver that is capable of correcting a shift of a resonance frequency and improving reception quality even when the resonance frequency is shifted from a desired position due to a change in usage or environment of an antenna device.

A digital signal receiver according to an aspect of the present invention includes an antenna device including a resonance circuit formed by a radiation conductor and a variable capacitance element coupled to the radiation conductor and resonating at a resonance frequency corresponding to a tuning voltage supplied to the variable capacitance element; a digital tuner unit connected at a subsequent stage of the antenna device and receiving a digital signal in a reception channel having a predetermined bandwidth; a demodulation unit demodulating a digital reception signal that has been subjected to multicarrier modulation output from the digital tuner unit; antenna tuning control means for supplying to the antenna device a tuning voltage corresponding to the reception channel; and correction means for detecting levels of a plurality of carriers in the bandwidth of the reception channel and for correcting the tuning voltage so as to reduce a level difference between the carriers to a predetermined value or less.

With this configuration, levels of a plurality of carriers in the bandwidth of a reception channel are detected, and a tuning voltage is corrected so as to reduce a level difference between the carriers to a predetermined value or less. Thus, even when a resonance frequency is shifted due to a change in usage or environment of the antenna device, the shift of the resonance frequency can be corrected, thus achieving an improvement in reception quality.

In addition, in the digital signal receiver, the digital signal is a digital television signal, and the plurality of carriers are carriers of a spread pilot signal.

Accordingly, even when a resonance frequency is shifted due to a change in usage or environment of an antenna device, the shift of the resonance frequency can be corrected, thus achieving an improvement in reception quality.

BRIEF DESCRIPTION OF THE DRAWINGS

FIG. 5 is an equivalent circuit diagram of the antenna device shown in FIG. 4;

FIG. 6 is a functional block diagram showing a digital signal receiver of the related art;

DESCRIPTION OF THE PREFERRED EMBODIMENTS

Embodiments of the present invention will be described with reference to the attached drawings.

Figure 1:
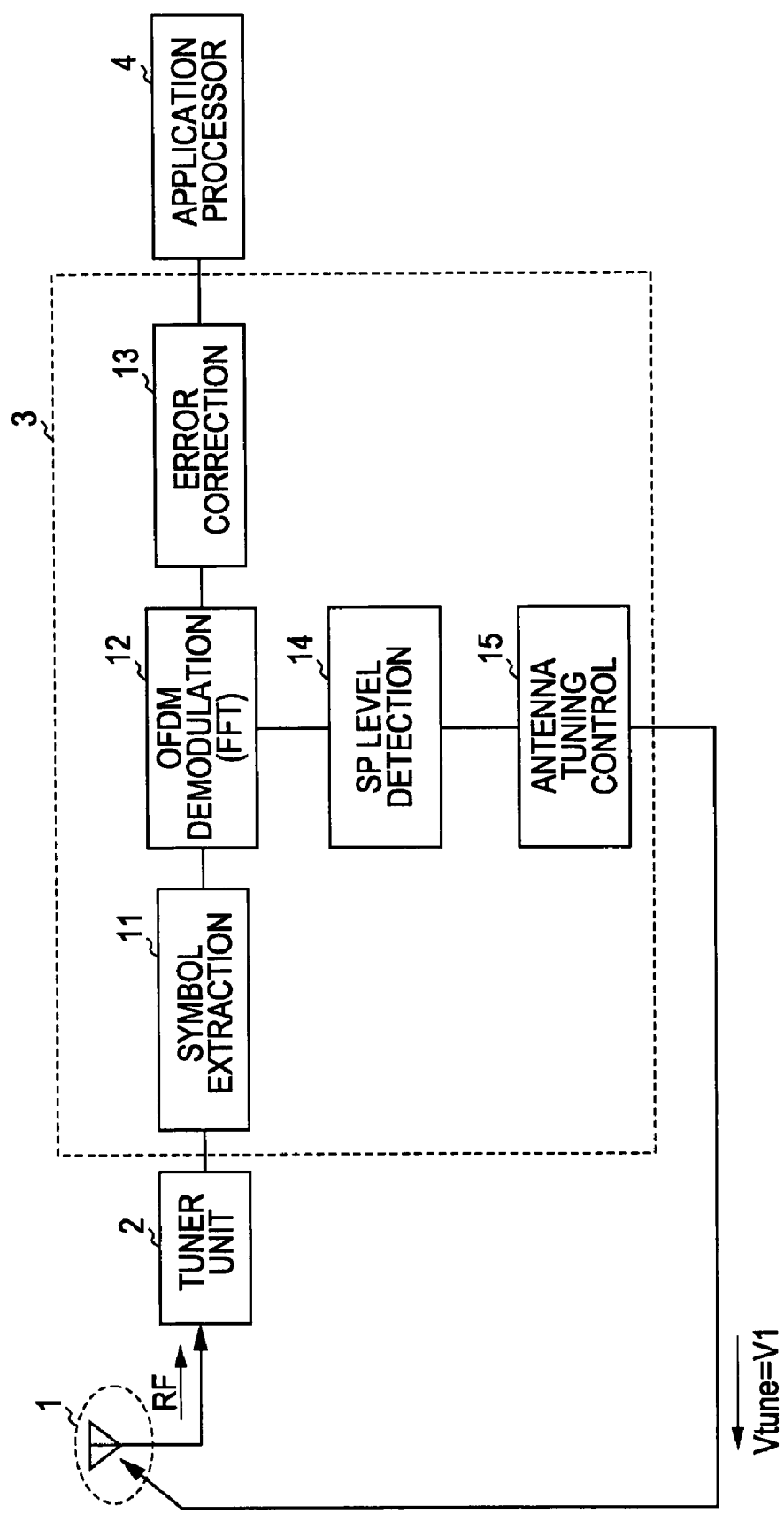
FIG. 1 is a functional block diagram showing a digital signal receiver according to an embodiment of the present invention.

FIG. 1 is a functional block diagram showing a digital signal receiver according to an embodiment of the present invention. As shown in FIG. 1, the digital signal receiver according to this embodiment includes an antenna device 1 tunable over a wide range of frequencies, a digital tuner unit 2 performing frequency conversion of an RF signal, which is a reception signal output from the antenna device 1, tuning the signal into a reception channel, and outputting a digital reception signal, and a demodulation circuit 3 demodulating the digital reception signal output from the digital tuner unit 2. The digital signal receiver outputs the demodulated digital signal to an application processor 4 provided at the subsequent stage.

Figure 4:
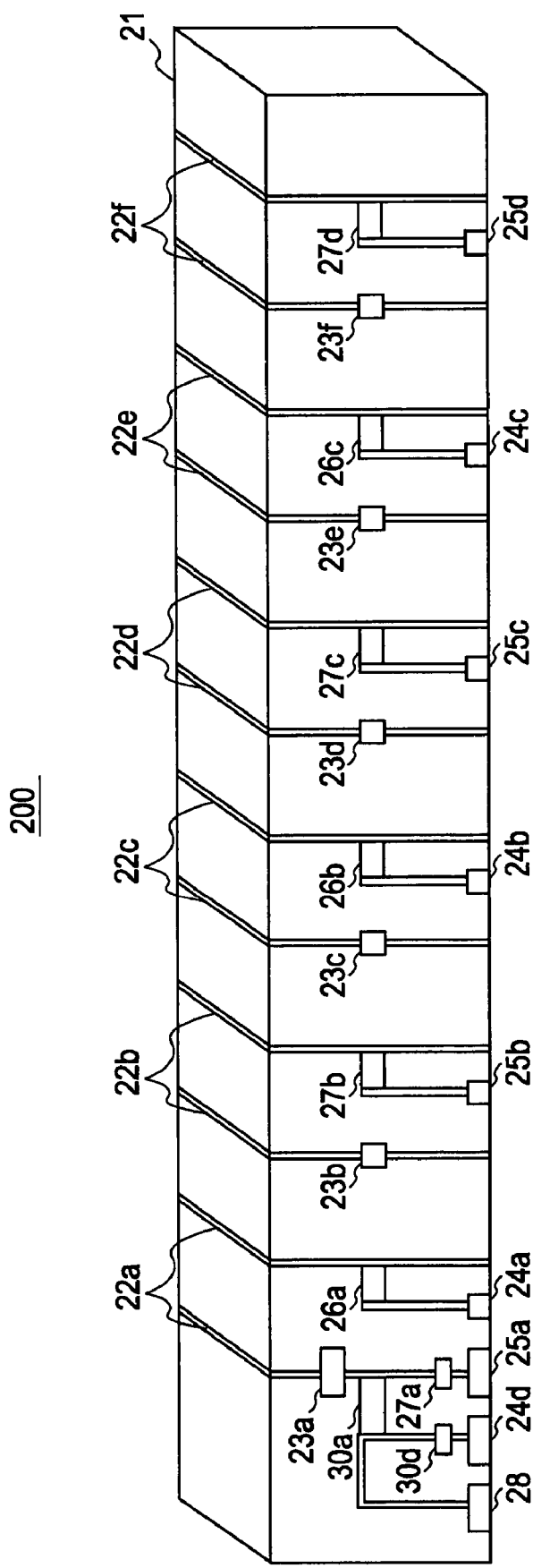
FIG. 4 is a schematic diagram showing an antenna device of the related art.
Figure 7A:
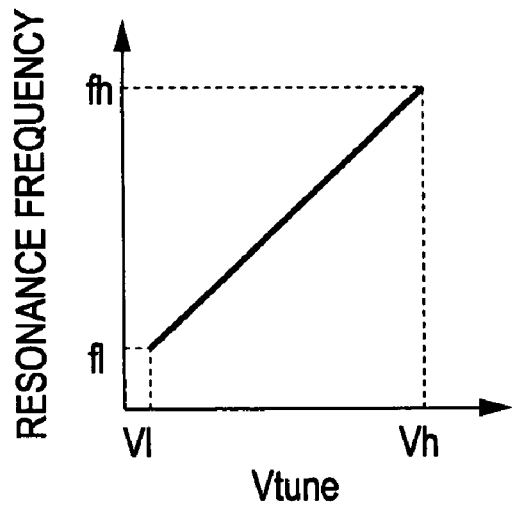
FIG. 7A is a characteristic diagram showing the relationship between a tuning voltage applied to the antenna device and a resonance frequency.
Figure 7B:
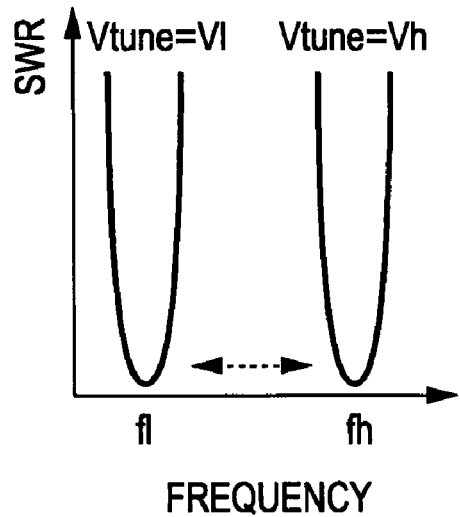
FIG. 7B is an SWR characteristic diagram showing the relationship between a resonance frequency and the SWR.

The antenna device 1 contains radiation conductors and variable capacitance elements coupled to the radiation conductors. The antenna device 1 is capable of resonating with respect to a reception signal. The antenna device 1 can be configured similarly to the antenna device 200 shown in FIGS. 4 and 5. In this embodiment, the antenna device 1 has the same configuration as the above-described antenna device 200, and the configuration of the antenna device 1 will be described using the reference numerals shown in FIGS. 4 and 5 in an appropriate manner.

The demodulation circuit 3 includes a symbol extraction unit 11 extracting symbols from a digital reception signal, an orthogonal frequency-division multiplexing (OFDM) demodulation unit 12 demodulating extracted symbol data by performing FFT (fast Fourier transform) processing, and an error correction unit 13 correcting demodulated data obtained by OFDM demodulation. In addition, in this embodiment, the demodulation circuit 3 includes an SP level detection unit 14 serving as correction means having a function of correcting a tuning voltage so as to reduce a level difference between a plurality of carriers in the bandwidth of a reception signal to a predetermined value or less and an antenna tuning control unit 15 correcting a tuning voltage set in advance so as to correspond to the reception signal using a correction amount designated by the SP level detection unit 14 and outputting the corrected tuning voltage.

The relationship between the inclination of reception signal level and a shift from a desired resonance frequency will be described with reference to FIGS. 2A and 2B. In the current terrestrial digital television broadcasting (for example, Japanese integrated services of digital broadcasting-terrestrial (ISDB-T)), an OFDM modulation method, which is one of multicarrier modulation methods, is adopted as a modulation method for transmission data. In this method, 5617 carriers are used as modulation carriers, and a pilot signal (hereinafter, referred to as a "spread pilot signal SP") is arranged for each twelve carriers.

Figure 2A:
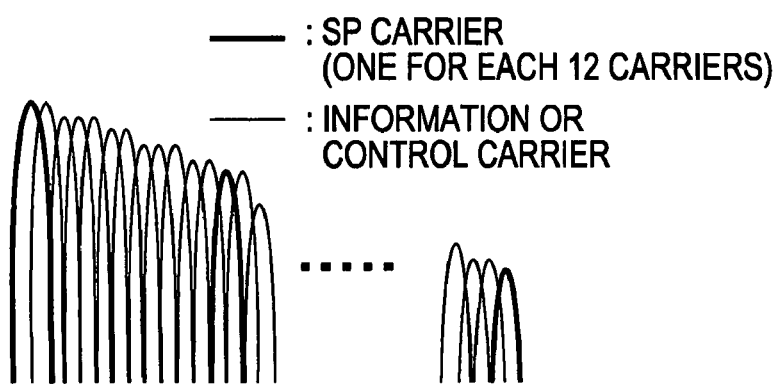
FIG. 2A is a waveform chart showing a state of signal level of multicarriers in which spread pilot signals are arranged.
Figure 2B:
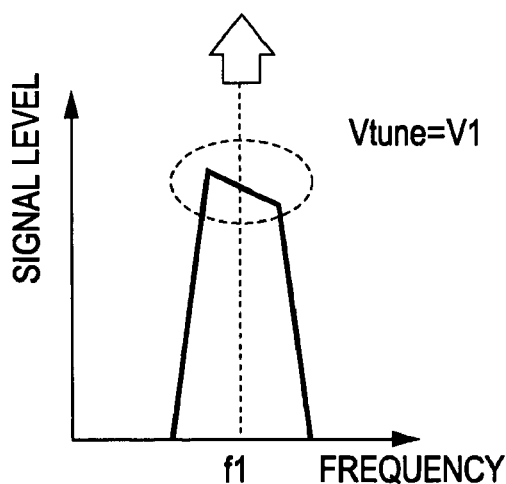
FIG. 2B is a frequency characteristic diagram showing a state of signal level after OFDM demodulation is performed for the multicarriers shown in FIG. 2A.

For example, if a resonance frequency set by the tuning voltage, Vtune=Vl, is shifted toward lower frequencies from the original frequency fl (see FIG. 8A), multicarriers in the bandwidth of a reception channel exhibit a shape in which the right shoulder drops, as shown in FIG. 2A, and the signal level of a demodulated reception channel also exhibits a shape in which the right shoulder drops, as shown in FIG. 2B.

When attention is focused on spread pilot signals SP that are substantially uniformly spread over the multicarriers, it is clear that, similarly to the inclination of all the multicarriers, the inclination of signal level of spread pilot signals SP exhibits a shape in which the right shoulder drops. When the resonance frequency of the antenna device 1 is shifted toward higher frequencies from the original frequency fl, demodulated multicarriers exhibit a shape in which the left shoulder drops, and similarly to the inclination of all the multicarriers, the inclination of spread pilot signals SP exhibits a shape in which the left shoulder drops. The inclination of signal level of spread pilot signals SP indicates that the current resonance frequency is shifted from the original frequency. The direction of the inclination of signal level of spread pilot signals SP indicates that the direction toward which the resonance frequency is shifted from the original frequency fl.

The SP level detection unit 14 detects signal levels of all the spread pilot signals SP or a predetermined number of spread pilot signals SP at least in the bandwidth of a reception channel, obtains a correction amount $\Delta V$ for the current tuning voltage, Vtune=Vl, on the basis of the inclination of the detected signal levels, and reports the correction amount $\Delta V$ to the antenna tuning control unit 15. For example, a difference D between the signal level of a spread pilot signal SP at a disposed position P1 and the signal level of a spread pilot signal SP at a disposed position P2, which is distant from the disposed position P1 by a predetermined frequency, is obtained. The polarity of the obtained difference D indicates an inclination direction, and the value obtained by dividing the absolute value of the difference D by a pilot interval (P1-P2) indicates the width of a shift, which is the magnitude of inclination. Thus, in accordance with the polarity of the difference D and the magnitude of the inclination, it is determined which direction (upward or downward) and what degree correction is to be made from the current tuning voltage. Increasing the number of spread pilot signals SP causes the detection accuracy to increase. It is desirable that the number of spread pilot signals SP and the disposed positions of the spread pilot signals SP are set so as to correspond to a desired detection accuracy. In accordance with a calculated difference D between signal levels of a plurality of spread pilot signals SP set in advance, the SP level detection unit 14 calculates a correction amount $\Delta V$ so that uniform signal levels of the spread pilot signals SP can be achieved over the bandwidth of the reception channel. That is, a difference D between spread pilot signals SP is compared with a threshold, and a correction amount that allows the difference D to be reduced to the threshold or less is determined.

The antenna tuning control unit 15 corrects a tuning voltage (fixed voltage before correction) set in advance in accordance with a channel selection signal, which is not shown, using a correction amount $\Delta V$ designated by the SP level detection unit 14, generates a corrected tuning voltage, Vtune=Vl+correction amount $\Delta V$, and applies the corrected tuning voltage to the antenna device 1.

An operation in this embodiment configured as described above is described next.

Figure 8A:
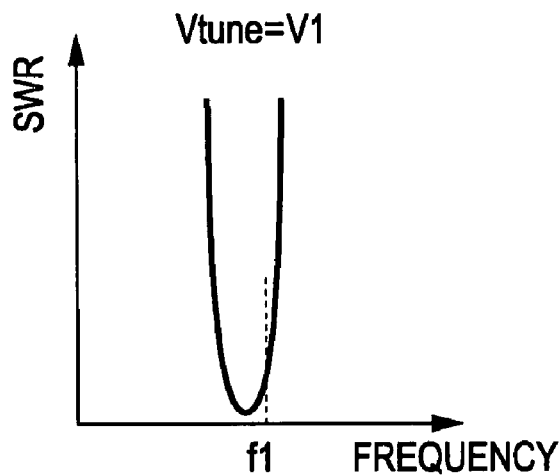
FIG. 8A illustrates SWR characteristics when a resonance frequency is shifted from the original position.
Figure 8B:
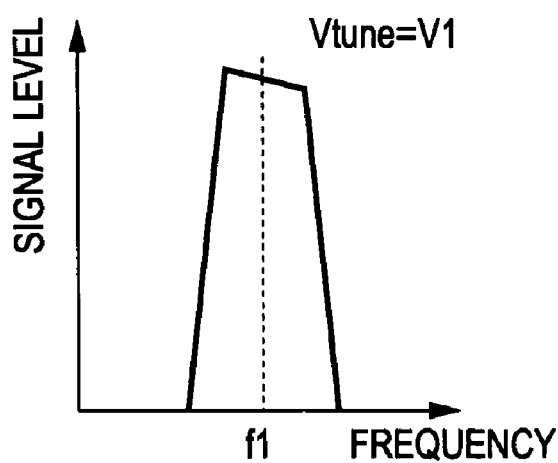
FIG. 8B is a frequency characteristic diagram showing a state of signal level after OFDM demodulation is performed for a reception channel received at the resonance frequency shown in FIG. 8A.

The antenna tuning control unit 15 generates a tuning voltage, Vtune=Vl, which is a fixed voltage before correction set in advance in accordance with a channel selection signal, and applies the tuning voltage, Vtune=Vl, to the second electrodes 25a to 25d of the antenna device 1. The resonance frequency of the antenna device 1 changes in accordance with the tuning voltage, Vtune=Vl, applied to the second electrodes 25a to 25d. Here, it is assumed that, when the tuning voltage, Vtune=Vl, is applied, the resonance frequency is shifted toward lower frequencies from a desired resonance frequency fl by a predetermined amount, as shown in FIG. 8A. The antenna device 1 exhibits narrow-band characteristics in which a resonance frequency (fl-$\alpha$), which is shifted from the desired resonance frequency fl, serves as a center frequency, and an RF reception signal received in accordance with the narrow-band characteristics is output from a discharge end (the radiation conductor 22f) to the digital tuner unit 2. The digital tuner unit 2 performs frequency conversion for the RF reception signal to be converted into an intermediate-frequency signal. The digital tuner unit 2 also tunes the signal into a reception channel, and outputs a digital reception signal including a signal component shifted from the reception channel by the predetermined amount.

In the demodulation circuit 3, the symbol extraction unit 11 extracts symbols from the digital reception signal, and the OFDM demodulation unit 12 performs OFDM demodulation. Demodulated data obtained here exhibits frequency characteristics exhibiting a shape in which the right shoulder drops, as shown in FIG. 2B. The SP level detection unit 14 calculates a difference D on the basis of signal levels of a plurality of spread pilot signals SP set in advance. On the basis of the calculated difference D, the SP level detection unit 14 calculates a correction amount $\Delta V$ that achieves uniform signal level at least in the bandwidth of the reception channel, and reports the correction amount $\Delta V$ to the antenna tuning control unit 15. The antenna tuning control unit 15 generates a corrected tuning voltage, Vtune=Vl+correction amount $\Delta V$, which is obtained by correcting the current tuning voltage Vl using the correction amount $\Delta V$, and applies the corrected tuning voltage, Vtune=Vl+correction amount $\Delta V$, to the antenna device 1.

Figure 3A:
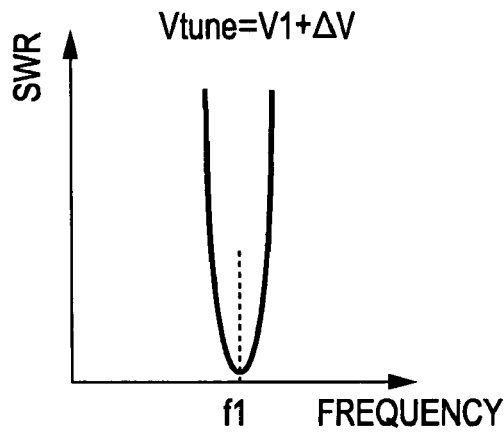
FIG. 3A illustrates a state of a corrected resonance frequency.

The resonance frequency of the antenna device 1 is shifted to the original frequency fl, as shown in FIG. 3A, due to the application of the corrected tuning voltage, Vtune=Vl+correction amount $\Delta V$, to the second electrodes 25a to 25d. Thus, since the actual resonance frequency of the antenna device 1 is equal to the frequency fl, the currently selected reception channel can be received without loss. As a result, the signal level of demodulated data obtained by OFDM demodulation by the OFDM demodulation unit 12 exhibits a flat shape, as shown in FIG. 3B.

Figure 3B:
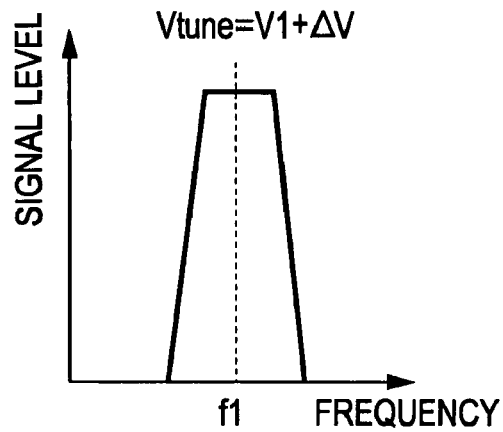
FIG. 3B is a frequency characteristic diagram showing a state of signal level after OFDM demodulation is performed for a reception channel received at the resonance frequency shown in FIG. 3A.

If the signal level of demodulated data forms a flat shape, as shown in FIG. 3B, the difference D calculated by the SP level detection unit 14 is smaller than or equal to the threshold. When the difference D is smaller than or equal to the threshold, the SP level detection unit 14 maintains the current tuning voltage Vtune, and does not perform further correction.

As described above, according to this embodiment, the inclination of signal levels is detected on the basis of a difference D between a plurality of spread pilot signals SP, and a tuning voltage Vtune is corrected using a correction amount ΔV, which allows the difference D between the spread pilot signals SP to be reduced to the threshold or less. Thus, even when a resonance frequency is shifted due to a change in usage or environment of the antenna device 1, the shift of the resonance frequency can be corrected, thus achieving an improvement of reception quality.

Although the inclination of signal levels is detected on the basis of a difference between a plurality of spread pilot signals SP in the above description, spread pilot signals SP are not necessarily used in the present invention. Information or other carriers, such as control carriers, may be used. In addition, detection of the inclination of signal levels is not necessarily performed using a difference method. The inclination of signal levels may be detected using any other detection principles, such as differentiation or detection.

The present invention is applicable to a digital signal receiver presetting a tuning voltage suitable for a reception channel for an antenna device.

What is claimed is:

1. A digital signal receiver comprising:
an antenna device including a resonance circuit formed by a radiation conductor and a variable capacitance element coupled to the radiation conductor, and resonating at a resonance frequency corresponding to a tuning voltage supplied to the variable capacitance element;
a digital tuner unit connected at a subsequent stage of the antenna device, the digital tuner unit receiving a digital signal in a reception channel having a predetermined bandwidth and outputting a digital reception signal, the digital reception signal including a plurality of carriers within the predetermined bandwidth; and
a demodulation unit including:
a multicarrier demodulator for demodulating the digital reception signal;
antenna tuning control means for supplying to the antenna device a tuning voltage corresponding to a resonance frequency for the reception channel; and
correction means for detecting signal levels of the plurality of carriers in the bandwidth of the reception channel, and for correcting the tuning voltage by reducing a difference between the detected signal levels of the plurality of carriers to a predetermined value or less if the resonance frequency has shifted from an original resonance frequency of the reception channel of the antenna device.

2. A digital signal receiver, comprising:
an antenna device including a resonance circuit formed by a radiation conductor and a variable capacitance element coupled to the radiation conductor, and resonating at a resonance frequency corresponding to a tuning voltage supplied to the variable capacitance element;
a digital tuner unit connected at a subsequent stage of the antenna device, the digital tuner receiving a digital signal in a reception channel having a predetermined bandwidth and outputting a digital reception signal,
a demodulation unit including:
a multicarrier demodulator for demodulating the digital reception signal;
antenna tuning control means for supplying to the antenna device a tuning voltage corresponding a resonance frequency for the reception channel; and
correction means for detecting signal levels of a plurality of carriers in the bandwidth of the reception channel, and for correcting the tuning voltage so as to reduce a difference between the detected signal levels of the plurality of carriers to a predetermined value or less,
wherein the digital signal is a digital television signal, and the plurality of carriers are carriers of a spread pilot signal.

3. The digital signal receiver according to claim 1, wherein the correction means determines a shape of frequency characteristics of the multicarrier-demodulated digital reception signal based on the detected signal levels, the shape of the frequency characteristics indicating a shift from the original resonance frequency of the reception channel of the antenna device.

4. The digital signal receiver according to claim 1, wherein the digital signal is a digital television signal, and the plurality of carriers are carriers of a spread pilot signal.

* * * * *